United States Patent
Ghyselen et al.

(10) Patent No.: US 6,982,210 B2
(45) Date of Patent: Jan. 3, 2006

(54) METHOD FOR MANUFACTURING A MULTILAYER SEMICONDUCTOR STRUCTURE THAT INCLUDES AN IRREGULAR LAYER

(75) Inventors: Bruno Ghyselen, Seyssinet (FR); Takeshi Akatsu, Saint Nazaire les Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 86 days.

(21) Appl. No.: 10/728,341

(22) Filed: Dec. 3, 2003

(65) Prior Publication Data

US 2005/0009296 A1 Jan. 13, 2005

(30) Foreign Application Priority Data

Jul. 10, 2003 (FR) .................................. 03 08460

(51) Int. Cl.
*H01L 21/00* (2006.01)
(52) U.S. Cl. ...................................... 438/459
(58) Field of Classification Search ................ 438/455, 438/459

See application file for complete search history.

(56) References Cited

U.S. PATENT DOCUMENTS

| 6,191,007 B1 | 2/2001 | Matsui et al. ................ 438/459 |
| 2002/0089016 A1 | 7/2002 | Joly et al. .................... 257/349 |
| 2002/0164876 A1 * | 11/2002 | Walitzki et al. ............. 438/692 |
| 2003/0010445 A1 | 1/2003 | Yanagita et al. ............. 156/344 |
| 2003/0129780 A1 | 7/2003 | Auberton-Herve ........... 438/46 |
| 2004/0178448 A1 * | 9/2004 | Rayssac et al. .............. 257/347 |
| 2005/0028728 A1 * | 2/2005 | Liu et al. ....................... 117/86 |

FOREIGN PATENT DOCUMENTS

| EP | 1 398 829 A2 | 3/2004 |
| FR | 2781082 | 1/2000 |
| JP | 61240629 | 10/1996 |
| WO | WO 93/01617 | 1/1993 |
| WO | WO 00/48238 | 8/2000 |
| WO | WO 01/97282 A1 | 12/2001 |

* cited by examiner

*Primary Examiner*—Evan Pert
(74) *Attorney, Agent, or Firm*—Winston & Strawn LLP

(57) ABSTRACT

A method for manufacturing a multilayer semiconductor structure that includes an irregular layer. In an embodiment, the method includes providing a layer of irregular material on a donor substrate. The irregular layer has a flat face at an interface with the donor substrate, and has an opposite, irregular face. Next; a weakened zone is created at a predetermined depth within the donor substrate. An intermediate layer of material is then provided that covers the irregular face of the irregular layer, the intermediate layer providing a substantially flat surface. The substantially flat surface of the intermediate layer is then bonded to a receiver substrate, and the donor substrate is detached along the weakened zone to form the multilayer semiconductor structure. The multilayer structure includes an useful layer, the irregular layer, the intermediate layer and the receiver substrate, wherein all of the irregular material of the irregular layer is present in the structure.

21 Claims, 5 Drawing Sheets

METHOD FOR MANUFACTURING A MULTILAYER SEMICONDUCTOR STRUCTURE THAT INCLUDES AN IRREGULAR LAYER

BACKGROUND ART

This invention generally relates to a method for manufacturing a multilayer semiconductor structure that includes a layer of irregular material. In an embodiment, the method includes providing a layer of irregular material on a donor substrate, creating a weakened zone in the donor substrate, providing an intermediate layer that covers the surface of the irregular layer and provides a substantially flat surface, bonding the substantially flat surface of the intermediate layer to a receiver substrate, and detaching the donor substrate along the weakened zone to form the multilayer semiconductor structure.

The words "donor" and "receiver" correspond to the "active layer" and to the "support" of the wafer, respectively. These terms may also mean "top" and "base", respectively, at times. In addition, the expression "layer of irregular material" means a layer having at least one surface which is not regular (according to this definition, a layer of single-crystal silicon is typically a regular layer).

A layer of irregular material is, within this text, understood to be a layer of which at least one free surface has a roughness and a flatness greater than a value of a few angstroms expressed in terms of root mean square (RMS) values. Conversely, in this text, a layer is regular if the roughness of its free surfaces is less than such a value.

For example, a layer of irregular material can be made of CVD diamonds, of $Si_3N_4$, of AlN or even of a poly-crystal material such as, notably, poly-crystal silicon, and the like. Such rough materials can, for example, be implemented in a SOI (Silicon on Insulator) type structure to improve the heat conductive properties of such a wafer. It is contemplated that the insulator layer of such a wafer would not be made of $SiO_2$ (whose heat conducting properties are poor), but may be made of one or several materials that have high heat conductivity, such as diamonds or $Si_3N_4$. Layers of such materials are generally obtained via epitaxy. However the surface of such epitaxial layers is rough.

The table below presents examples of the heat conductivity coefficients for different materials.

| Material | Heat conductivity W/m/K |
| --- | --- |
| Buried oxide of the SIMOX structure | 1.6 |
| CVD diamond | $2 \times 10^3$ |
| AlN | >250 |
| $Si_3N_4$ | >150 |
| Si | 168 |

The word "bonding" means putting two surfaces into close contact so that links (for example. Van der Waals forces or hydrogen links) are created between the two surfaces (For example, see "Semiconductor Wafer Bonding Science and Technology", Wiley, 1999, Q.-Y Tong and U. Gösele). Such processes are known. In particular, the published International Application No. WO 01/97282 describes a process in which a zone of weakness is created by implanting atomic species. This type of process allows the fabrication of multilayer wafers including a layer of irregular material. Such implementation allows detachment along the weakened zone such that the remainder of the donor substrate which is present after detachment can be recycled. In addition, this type of process results in a wafer whose surface is homogenous (notably in terms of thickness), after detachment along the weakened zone. This type of process thus has a certain number of advantages. Moreover, this type of process results in a wafer whose layer of irregular material (for example in diamond) has one irregular face turned towards the useful layer of the wafer.

It is to be understood that the useful layer of the wafer is a superficial layer (a layer located in the immediate neighborhood of the wafer surface), in which components will be created. In addition, it would be of interest to obtain multilayer wafers in which a layer of irregular material has a regular face that is turned towards the useful layer of the wafer. Returning to the example of SOI type wafers having an insulator layer that is made of one or several irregular materials, this would allow the manufacture of an interface between the useful layer and the insulator layer that is as regular as possible. Such a structure would in particular improve the electric characteristics of the wafer.

SUMMARY OF THE INVENTION

Presented is a method for manufacturing a multilayer semiconductor structure that includes an irregular layer. The method includes providing a layer of irregular material on a donor substrate. The irregular layer has a flat face at an interface with the donor substrate, and has an opposite, irregular face. A weakened zone is created at a predetermined depth within the donor substrate. An intermediate layer of material is provided that covers the irregular face of the irregular layer, the intermediate layer providing a substantially flat surface. The substantially flat surface of the intermediate layer is then bonded to a receiver substrate, and the donor substrate is detached along the weakened zone to form the multilayer semiconductor structure. The multilayer structure includes an useful layer, the irregular layer, the intermediate layer and the receiver substrate, wherein all of the irregular material of the irregular layer is present in the structure.

In an advantageous embodiment, the method includes treating the substantially flat surface of the intermediate material layer prior to bonding. The weakened zone may be formed by implanting atomic species into the donor substrate to a controlled mean implantation depth, and a heat treatment may be used to detach the donor substrate from the multilayer semiconductor structure. Advantageously, the irregular material layer may be deposited on the donor substrate, and chemical vapor deposition (CVD) may be used.

In a preferred embodiment, the intermediate layer is provided prior to creating the weakened zone in the donor substrate. In a variation, the weakened zone is created in the donor substrate prior to providing the intermediate material layer. In yet another variation, the weakened zone is created in the donor substrate prior to providing the layer of irregular material on the donor substrate. Atomic species may be implanted into the donor substrate to a controlled mean implantation depth to form the weakened zone, and the donor substrate detached along the weakened zone by exposing the wafer to an appropriate heat budget. Alternately, a detachable donor substrate having a weakened zone may be fabricated. The weakened zone may be created by at least one of providing a porous region in the donor substrate, providing a reversible bonding interface between two wafers that comprise the donor substrate, or implanting atomic species into the donor substrate with a dosage that requires a predetermined amount of mechanical energy to detach the donor substrate along the weakened zone.

The useful layer of the multilayer semiconductor structure may advantageously be made of at least one of silicon (Si), silicon-germanium (SiGe), germanium (Ge), silicon-carbon (SiC), gallium-nitride (GaN), gallium-arsinide (GaAs), or a Group (III–V) material. In addition, the multilayer semiconductor structure may be a silicon-on-insulator (SOI) type structure. A beneficial implementation includes providing a layer of electrical insulator material between the useful layer and the layer of irregular material. In this case, the electrical insulator material may be made of silicon-oxide ($SiO_2$) or $Si_3N_4$, and may be about 50 Å thick.

The present method advantageously results in a multilayer semiconductor structure that includes a layer of irregular material having a regular face that is positioned towards the useful layer. For SOI type wafers having an insulator layer that is made of one or several irregular materials, the method permits the manufacture of an interface between the useful layer and the insulator layer that is as regular as possible. Such a structure improves the electric characteristics of the wafer. The method also avoids any significant loss of matter during the implementation of the process. Further, the invention permits recycling of the remains of the substrate. The methods according to the invention also permit the manufacture of multilayer wafers having a homogenous useful layer.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1:
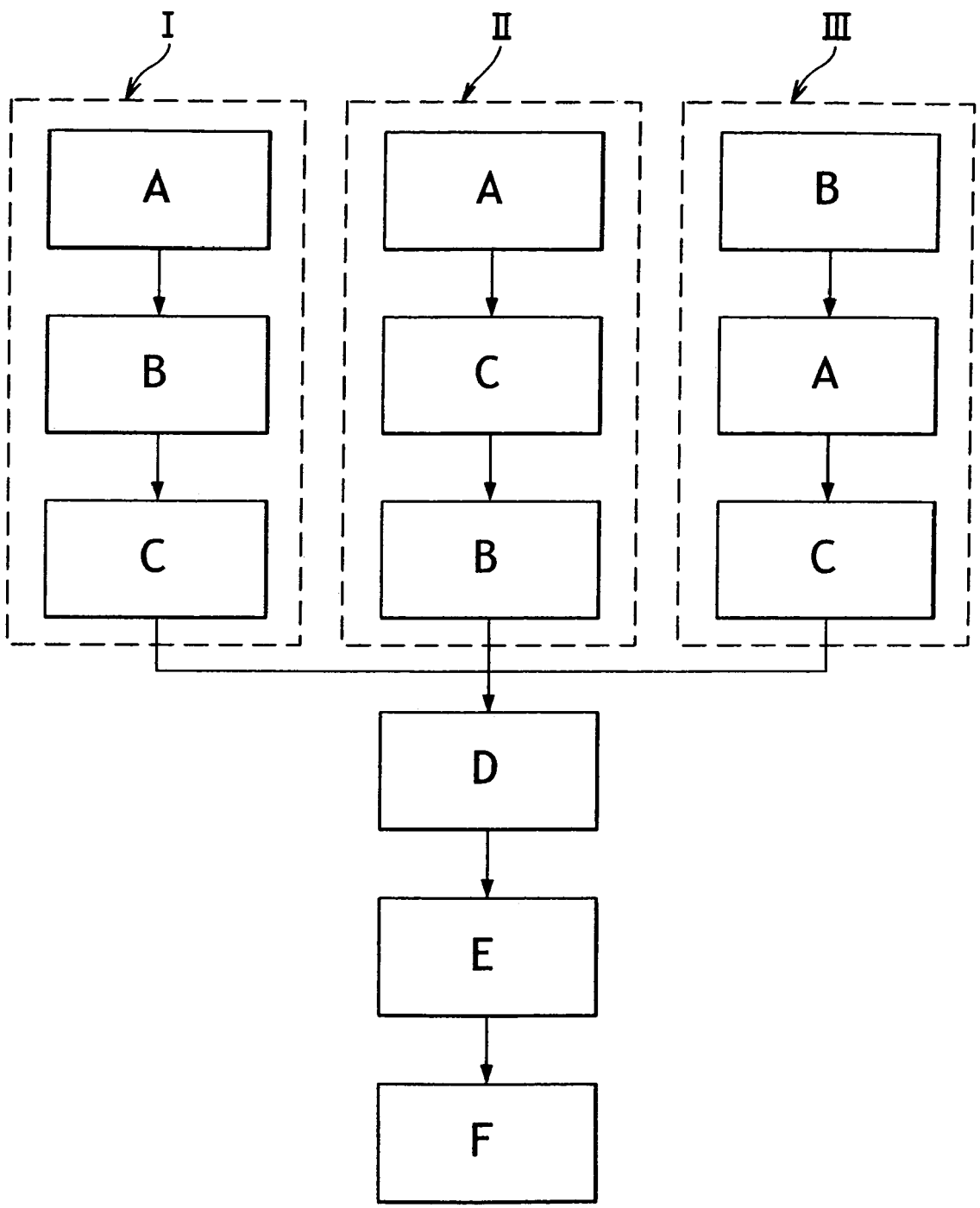
FIG. 1 is a block diagram depicting an overall representation of the process according to the invention, showing in particular three principal embodiments labeled as methods I, II and III, which illustrate that the process can include different alternatives within the stages A to F.

FIG. 1 is a block diagram representing the principal stages that can be implemented in a process according to the invention. The invention can be implemented to create a multilayer wafer comprising a useful layer which can in particular (but not restrictively) be made of at least one of the following materials: Si, SiGe, Ge, SiC, GaN, GaAs, III–V. In addition, the structure may be, in particular, of a silicon-on-insulator (SOI) type.

As explained below, it is possible to optimize the electric characteristics of the interface with the useful layer by using a thin layer of electrical insulator material between the useful layer and the layer of irregular material. This material can for example be in $SiO_2$ or in $Si_3N_4$. Such a layer of electrical insulator material can have a thickness of about 50 Å.

The block diagram of FIG. 1 highlights three principal embodiments that can globally comprise the same stages that occur in different orders. In general, FIG. 1 shows stages A to F. Stage A represents creating a layer of irregular material on a donor substrate. Stage B represents creating a weakened zone in a donor substrate. Stage C represents flattening an irregular surface of the layer of irregular material, Stage D represents positioning the donor substrate and bonding it onto a receiver substrate. Stage E represents detaching the donor substrate along the weakened zone. Lastly, stage F represents a thinning and/or finishing step of the free surface or useful layer that results from the detachment step of stage E. It should be understood that stage E is optional, and the present method can be implemented without using stage F.

Below are descriptions of three preferred embodiments of the invention.

Method I

In this first principal embodiment, the stages are performed in alphabetical order: A, B, C, D, E and optionally, F. Thus, a layer of irregular material 12 is first provided on a donor substrate 10. The substrate 10 is made of a semiconductor material such as silicon. It can in particular be a single-crystal silicon. The substrate 10 corresponds to a donor substrate, part of which will be transferred to another substrate called the receiver substrate. The irregular layer 12 can be made of a poly-crystal material such as poly-crystal silicon, or even of a diamond material, silicon nitride or silicon carbide. This is applicable to all of the embodiments of the invention. Such a material is typically very hard (in the case of diamonds, for example) which is difficult to uniformly polish because it is heterogeneous (for example, poly-crystal silicon). Such materials are difficult to polish, and consequently difficult in general to flatten. Such materials may also be high cost materials, and thus it is desirable to limit the loss of such materials, due to processing for example, as much as possible.

The irregular layer 12 may be obtained via depositing a material on the flat surface of the donor substrate 10. For example, a CVD (Chemical Vapor Deposition) type technique could be used to deposit a material onto the donor substrate. It is to be noted that the layer 12 is thus admittedly an irregular layer, but it includes a flat face 121 at the interface with the donor substrate 10. In addition, the face of the donor substrate upon which the irregular material is deposited is also flat.

The other face 120 of the irregular layer 12—which is opposite to the donor substrate 10—has irregularities. Consequently, this face 120 cannot be bonded with another substrate while in this state.

Stage A thus corresponds to providing a layer of irregular material 12 on the donor substrate 10. It should be understood that in this embodiment, and in the other embodiments, it is possible at the beginning of stage A to associate a thin electrical insulator layer with the surface of the donor substrate 10, prior to depositing the irregular layer 12. In this case, the electrical insulator layer is inserted between the substrate 10 and the layer of irregular material 12. The insulator layer can be deposited onto the surface of the donor substrate 10 or may otherwise be provided via any known technique. This insulator layer can, as already mentioned, be made of, for example, $SiO_2$ or $Si_3N_4$; and it can have a thickness of about 50 Å. The role of such an insulator layer is to optimize the electrical characteristics of the interface between the layer of irregular material 12 and that which will correspond to the useful layer of the finished semiconductor structure.

Figure 3:
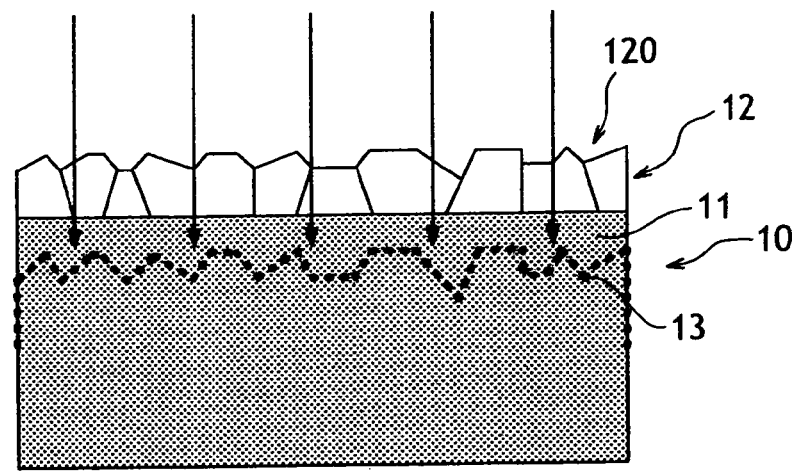
FIG. 3 shows stage B of Method I of FIG. 1.

FIG. 3 shows how a weakened zone 13 is created in the donor substrate 10 according to an embodiment. In this preferred embodiment, the weakened zone 13 is created by implanting atomic species through the layer of irregular material 12. For example, hydrogen and/or helium ions may be implanted to form the weakened zone 13, as shown by the arrows in FIG. 3. This step corresponds to stage B.

Figure 4:
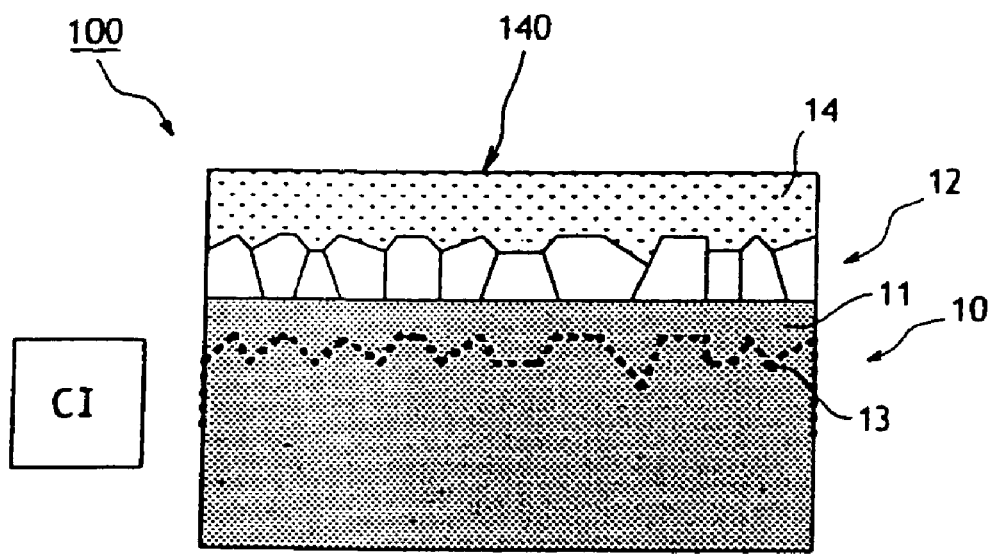
FIG. 4 shows stage C of Method I of FIG. 1.

FIG. 4 represents the outcome of the next stage C, wherein the irregular surface of the irregular layer is flattened. In the preferred embodiment, and in the other embodiments, preferably an intermediate material is deposited onto the irregular surface of the layer of irregular material 12 so as to entirely cover the irregular surface with a given thickness of intermediate material. A surface treatment may then be conducted on a surface of the intermediate material. For example, the surface treatment can be a polishing step. It is also envisaged that (once again for all the embodiments according to the invention), in stage C the intermediate material is deposited to cover the layer of irregular material 12. Moreover, such a deposit directly results in a surface of the intermediate layer whose state (flatness and roughness) is suitable for bonding without any additional surface treatment.

The intermediate material can be an amorphous material. It can for example be in amorphous silicon, but also in any other amorphous material (for example a silicide, such as titanium silicide ($TiSi_2$), or palladium silicide ($Pd_2Si$)).

A layer of intermediate material 14 is thus provided whose surface state permits bonding with another substrate. The layer 14 can be deposited via a chemical vapor deposition (CVD) type technique.

Referring to FIG. 4, an intermediate structure 100 has been made that includes the donor substrate 10 having a weakened zone 13, the layer of irregular material 12 having a face turned towards the donor substrate that is regular or flat, the layer of intermediate material 14 which entirely covers the irregular layer 12, and whose flat surface 140 permits bonding.

Figure 6:
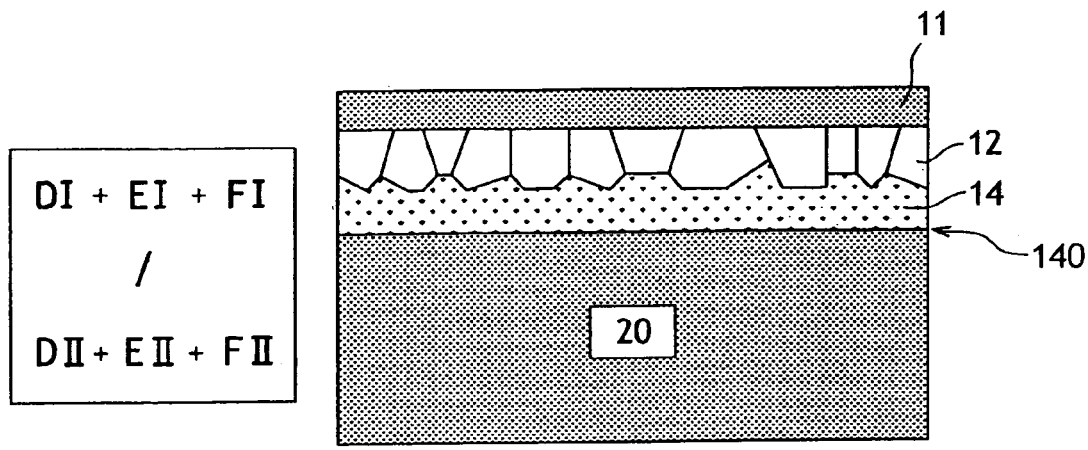
FIG. 6 shows stages D to F of Methods I and II of FIG. 1.

FIG. 6 corresponds to stages D, E and F of this embodiment of the invention. In particular, stage D corresponds to positioning the intermediate structure 100 and bonding it to a receiver substrate 20. In this regard, it is the flat surface 140 of the layer 14 which contacts the likewise flat surface of the receiver substrate 20. Prior to this bonding, the surface 140 may have received a light surface treatment. It is to be noted, however, that such a treatment is completely different from the substantial treatment which would have been necessary to enable the layer 12 to be bonded directly to the receiver substrate 20 in the absence of the layer of intermediate material. The receiver substrate 20 is typically made in silicon, for example in single-crystal silicon.

The next stage E consists of detaching the donor substrate 10 along the weakened zone 13. For this purpose, the weakened zone 13 undergoes, as known, a heat and/or mechanical action. The weakened zone may have been created via implantation, and thus the detachment stage can be carried out by following a SMART-CUT® type process. A general description of this type of process can be found in the publication entitled "Silicon-On-Insulator Technology: Materials to VLSI, $2^{nd}$ Edition" by Jean-Pierre Colinge, Kluwer Academic Publishers, pages 50 and 51.

The bonding interface can be stabilized by applying a heat treatment. Such a stabilizing step can be applied after detachment (stage E), and prior to a possible stage F, in all the embodiments according to the invention.

Stage F corresponds to a surface treatment of the part of the donor substrate 10 which is attached to the irregular layer 12, which is the useful layer 11. Such surface treatments can include additional thinning of the useful layer, and/or a flattening (for example, by using a chemical-mechanic polishing (CMP) technique). The finished structure thus achieved is represented in FIG. 6. This structure is a multilayer wafer comprising a layer of irregular material.

It is to be noted that the face of the layer of irregular material which is turned towards the useful layer 11 is perfectly flat, which is advantageous. It is also to be noted that this multilayer wafer was made without any loss of matter which is normally associated with processes that thin the substrates via etching or via other techniques that erode materials. In addition, it is to be noted that this multilayer wafer was made without any flattening difficulties, which may occur when methods such as polishing are used to flatten the irregular surface of the layer 12. Finally, thanks to the fact that the multilayer wafer was made without having to polish the layer 12, not only was a long and fastidious operation avoided, but loss of matter of the layer 12 was avoided (such losses can be detrimental, for example, when the layer 12 is made of an expensive material such as diamonds).

Method II

Figure 2:
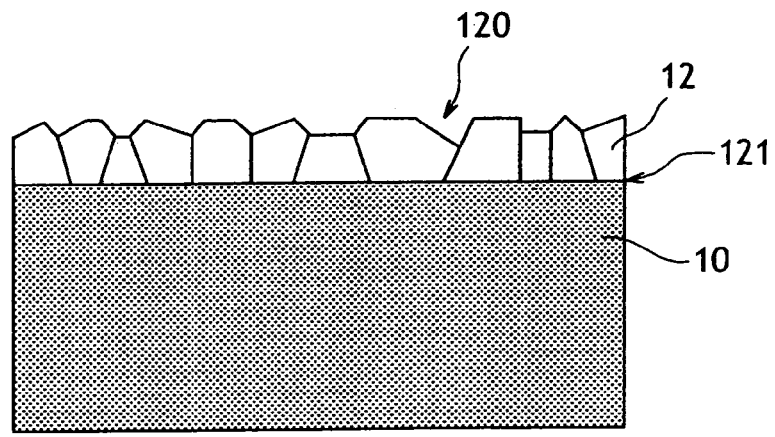
FIG. 2 illustrates stage A of Methods I and II of FIG. 1.

In this method the stages are performed in the following order: A, C, B, D, E and F. Stage A is equivalent to that described above with reference to Method I. Thus, in this regard reference can once again be made to FIG. 2.

The next stage C corresponds to flattening the irregular surface 120 of the layer 12, which was deposited onto the donor substrate 10. The flattening step can be conducted under the same conditions as previously described with respect to Method I. Reference can thus be made to FIG. 4 (the only difference being that in this case the weakened zone 13 has not as yet been formed).

Stage B is then undertaken to create the weakened zone 13 within the donor substrate 10. Once again this stage may be carried out by implanting atomic species. The implanting in this case is through the layer of intermediate material 14 of the layer of irregular material 12 and within a desired thickness of the donor substrate 10. In fact, in all the embodiments of the invention, the implantation characteristics are defined so that the average thickness of the weakened zone 13 within the thickness of the donor substrate 10 is controlled.

Figure 5:
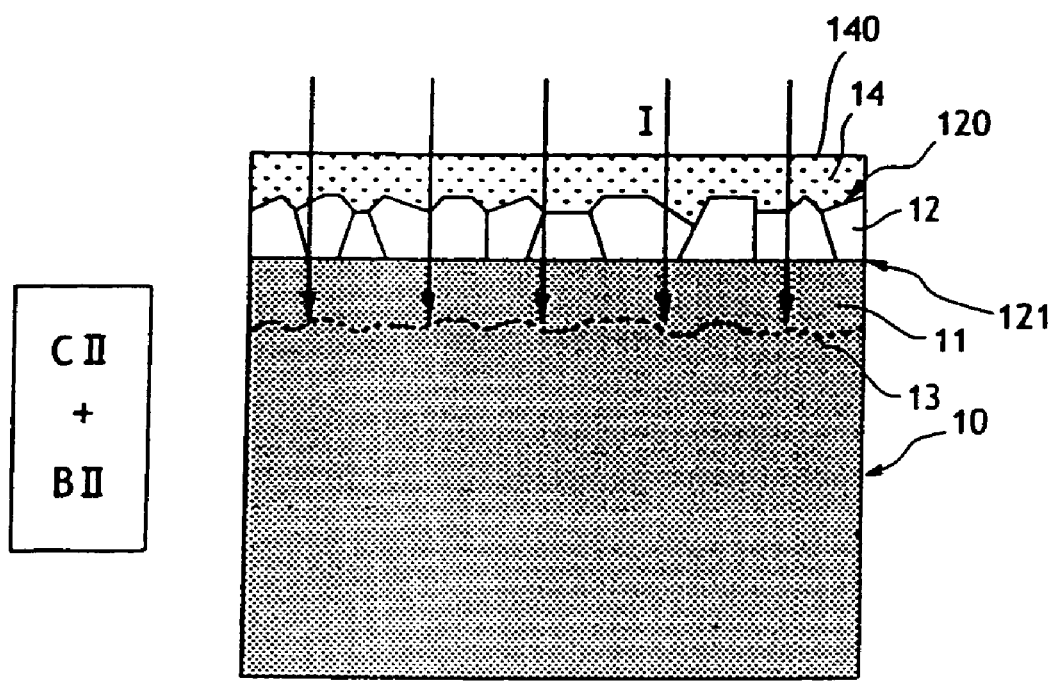
FIG. 5 illustrates stages C and B of Method I of FIG. 1, wherein these stages take place in the order shown.

It is noted that in reference to FIG. 5, which represents the outcome of stages C and B for Method II, the weakened zone 13 has a more regular profile than that of the weakened zone in the case of Method I. This is due to the fact that the irregular surface of the layer 12 was covered with a layer 14 which has a flat surface. Under these conditions, the irregularities of the weakened zone 13 are largely relieved, and the weakened zone assumes a profile similar to a plane despite the irregularities of the layer 12. Thus, method II is a particularly advantageous embodiment of the invention.

The next stages D, E and F are equivalent to that described above with regard to Method I and thus reference can once again be made to FIG. 6. It is simply to be noted that in this embodiment (Method II), the optional flattening and finishing operations of the surface of the useful layer 11 are diminished in comparison to what might be required for Method I. This results from the fact that the weakened zone 13 is, in the case of Method II, more regular.

Method III

In this principal embodiment, the stages are performed in the following order: B, A, C, D, E and F. Stage B corresponds to the creating a weakened zone in the thickness of the donor substrate 10. This weakened zone can, as in the other embodiments according to the invention, be created by implanting atomic species into the thickness of the donor substrate. It is possible in this embodiment of the invention to carry out the implantation step as described above for Methods I and II so that detachment can then be conducted by simple heat annealing. It is also possible to "under dose" the implanting of atomic species, as will be explained. In every case, a flat weakened zone 13 is obtained as implantation is not carried out through a layer of irregular material It is also possible to create a weakened zone via other methods, in particular by providing a donor substrate 10 that includes a "detachable" area along the zone 13. Such a detachable substrate, in which detachment can be conducted by a mechanical action along the weakened zone 13, can be created for example by creation of a porous region in the thickness of the substrate 10. For this purpose, it is possible to utilize a thin layer of porous silicon on a single-crystal silicon substrate, and then to cover this layer of porous silicon with another layer of single-crystal silicon (obtained for example via epitaxy). In this regard reference can be made to U.S. Pat. No. 6,100,166 (which describes an ELT-RAN® type process).

A detachable donor substrate 10 may also be made by bonding two substrates 101 and 102 (see FIG. 7), the bonding conditions being defined so as to limit the bonding energy. In this case, the bonding is reversible under the effect of a mechanical action. In an implementation, this bonding, for example, brings two layers of oxide 1010 and 1020 into contact.

In another variation, a detachable substrate may be created by forming an implanted weakened zone 13 by using an implantation dosage inferior to that which would be required to create a zone that could be detached solely by being subject to a high heat budget. Such an implantation is "under dosed" in comparison to that required, for example, for the implantation step of a SMART-CUT® type process. The use of an under-dosed implantation allows the creation of a weakened zone 13 wherein the donor substrate can only be detached by applying a mechanical constraint (this mechanical constraint being itself applied after the weakened zone 13 is subjected to a heat budget to allow coalescence of this zone).

In all cases, a weakened zone 13 is created in the thickness of the donor substrate 10, which corresponds to stage B. Then a layer of irregular material 12 is deposited on the donor substrate 10. This corresponds to stage A. Once again, the depositing step can be carried out under the same conditions as previously described. The irregular surface of the layer 12 is then flattened, preferably by covering it with an intermediate layer 14 as described above. The result of stages B, A and C for this third embodiment is shown in FIG. 7.

Figure 7:
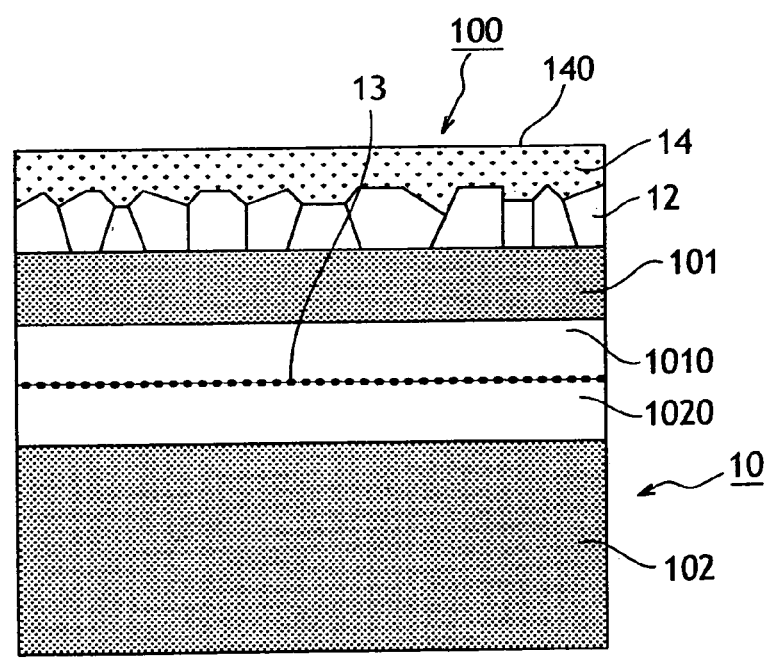
FIG. 7 shows stages B, A and C of Method III of FIG. 1, wherein these stages take place in the order shown.
Figure 8:
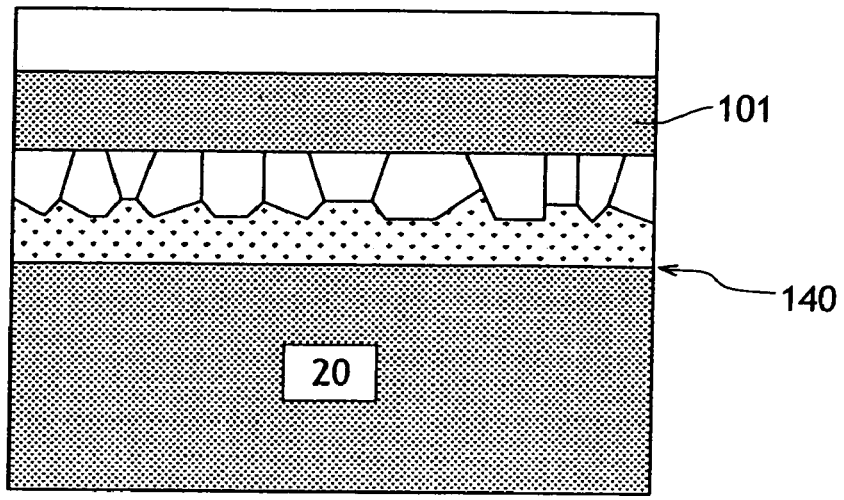
FIG. 8 shows stage E of Method III of FIG. 1.

Referring to FIG. 7, an intermediate structure 100 has again been created, which includes a weakened zone 13 and a layer of irregular material 12 on a donor substrate 10. This structure can be positioned or turned over for bonding with a receiver substrate 20. Such positioning and bonding correspond to the next stage D. The donor substrate 10 is detached along the weakened zone 13 (stage E). In the case where the weakened zone 13 is created solely via an implantation step, and with sufficient dosage, detachment can be achieved by simply subjecting the structure to an adequate heat budget (as for the detachment carried out in methods I and II). If a detachable substrate has been used, a mechanical action will be required in most cases to achieve the detachment. The resulting structure is represented in FIG. 8.

Figure 9:
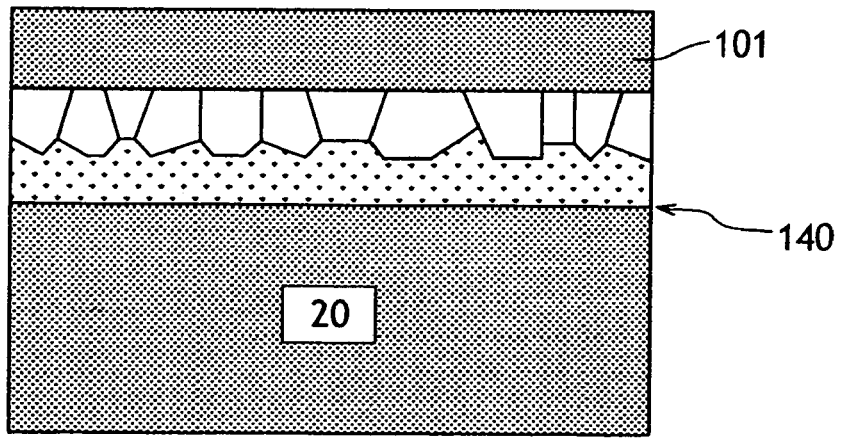
FIG. 9 shows stage F of Method III of FIG. 1.

Finally, it is once again possible to thin the resulting wafer and/or to treat its surface. The resulting structure that is finally obtained is shown in FIG. 9.

What is claimed is:

1. A method for manufacturing a multilayer semiconductor structure that includes an irregular layer, comprising:
   providing a layer of irregular material on a donor substrate to form an irregular layer having a flat face at an interface with the donor substrate and having a opposite, irregular face;
   creating a weakened zone at a predetermined depth within the donor substrate;
   providing an intermediate layer of material that covers the irregular face of the irregular layer, the intermediate layer providing a substantially flat surface;
   bonding the substantially flat surface of the intermediate layer to a receiver substrate; and
   detaching the donor substrate along the weakened zone to form the multilayer semiconductor structure that includes a useful layer, the irregular layer, the intermediate layer and the receiver substrate, wherein all of the irregular material of the irregular layer is present in the structure.

2. The method of claim 1 which further comprises treating the substantially flat surface of the intermediate material layer prior to bonding.

3. The method of claim 1 which further comprises implanting atomic species into the donor substrate to a controlled mean implantation depth to form the weakened zone.

4. The method of claim 1 which further comprises heat treating to detach the donor wafer from the multilayer semiconductor structure.

5. The method of claim 1 wherein the intermediate layer is provided prior to creating the weakened zone in the donor substrate.

6. The method claim 1 wherein the weakened zone is created in the donor substrate prior to providing the intermediate material layer.

7. The method claim 1 wherein the weakened zone is created in the donor substrate prior to providing the layer of irregular material on the donor substrate.

8. The method of claim 7 which further comprises implanting atomic species into the donor substrate to a controlled mean implantation depth to form the weakened zone.

9. The method of claim 8 which further comprises detaching the donor substrate along the weakened zone by exposing the wafer to an appropriate beat budget.

10. The method of claim 7 which further comprises fabricating a detachable donor substrate having a weakened zone.

11. The method of claim 10 which further comprises creating the weakened zone by at least one of providing a porous region in the donor substrate, providing a reversible bonding interface between two wafers that comprise the donor substrate, or implanting atomic species into the donor substrate with a dosage that requires a predetermined amount of mechanical energy to detach the donor substrate along the weakened zone.

12. The method of claim 1 wherein the intermediate material layer is made of an amorphous material.

13. The method of claim 12 wherein the intermediate material is amorphous silicon.

14. The method of claim 1 which further comprises depositing the irregular material layer on the donor substrate.

15. The method of claim 14 which further comprises depositing the irregular layer by chemical vapor deposition (CVD).

16. The method of claim 1 wherein the useful layer of the multilayer semiconductor structure is made of at least one of silicon (Si), silicon-germanium (SiGe), germanium (Ge), silicon-carbon (SiC), gallium-nitride (GaN), gallium-arsinide (GaAs), or a Group (III–V) material.

17. The method of claim 16 wherein the multilayer semiconductor structure is a silicon-on-insulator (SOI) type structure.

18. The method of claim 16 which further comprises providing a layer of electrical insulator material between the useful layer and the layer of irregular material.

19. The method of claim 18 wherein the electrical insulator material is made of silicon-oxide ($SiO_2$) or $Si_3N_4$.

20. The method of claim 19 wherein the electrical insulator layer is about 50 Å thick.

21. The method of claim 1 wherein the layer of irregular material is made of at least one of diamonds, $Si_3N_4$, AlN, or poly-crystal silicon.

* * * * *

UNITED STATES PATENT AND TRADEMARK OFFICE
CERTIFICATE OF CORRECTION

PATENT NO. : 6,982,210 B2
DATED : January 3, 2006
INVENTOR(S) : Ghyselen et al.

It is certified that error appears in the above-identified patent and that said Letters Patent is hereby corrected as shown below:

Column 8,
Line 14, after "interface with the donor substrate and having", change "a" to -- an --.
Line 55, after "the wafer to an appropriate", change "beat" to -- heat --.

Signed and Sealed this

Seventh Day of March, 2006

JON W. DUDAS
*Director of the United States Patent and Trademark Office*